United States Patent
Joshi et al.

(10) Patent No.: US 7,558,136 B2
(45) Date of Patent: *Jul. 7, 2009

(54) INTERNALLY ASYMMETRIC METHODS AND CIRCUITS FOR EVALUATING STATIC MEMORY CELL DYNAMIC STABILITY

(75) Inventors: Rajiv V. Joshi, Yorktown Heights, NY (US); Qiuyi Ye, Hopewell Junction, NY (US); Anirudh Devgan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/838,341

(22) Filed: Aug. 14, 2007

(65) Prior Publication Data

US 2007/0291562 A1 Dec. 20, 2007

Related U.S. Application Data

(60) Continuation of application No. 11/225,652, filed on Sep. 13, 2005, now Pat. No. 7,301,835, and a division of application No. 11/685,904, filed on Mar. 14, 2007, and a division of application No. 11/685,905, filed on Mar. 14, 2007, now Pat. No. 7,515,491.

(51) Int. Cl.
*G11C 29/00* (2006.01)
(52) U.S. Cl. ........................................ 365/201; 365/154
(58) Field of Classification Search ................... 365/201, 365/190, 154
See application file for complete search history.

(56) References Cited

U.S. PATENT DOCUMENTS

| 5,255,230 | A | * | 10/1993 | Chan et al. | ............... 365/201 |
| 5,687,178 | A | * | 11/1997 | Herr et al. | ............... 714/721 |
| 6,385,081 | B1 | * | 5/2002 | Shiomi | ............... 365/154 |
| 6,643,166 | B1 | * | 11/2003 | Ting et al. | ............... 365/154 |
| 7,099,182 | B2 | | 8/2006 | Ohtake et al. | |

(Continued)

OTHER PUBLICATIONS

U.S. Appl. No. 11/077,313, filed Mar. 10, 2005, Joshi, et al.
U.S. Appl. No. 11/225,652, filed Sep. 13, 2005, Joshi, et al.
U.S. Appl. No. 11/685,904, filed Mar. 14, 2007, Joshi, et al.
U.S. Appl. No. 11/685,905, filed Mar. 14, 2007, Joshi, et al.

*Primary Examiner*—Hoai V Ho
*Assistant Examiner*—Kretelia Graham
(74) *Attorney, Agent, or Firm*—Mitch Harris, Atty at Law, LLC; Andrew M. Harris; Libby Z. Handelsman

(57) ABSTRACT

A memory cell having an asymmetric connection for evaluating dynamic stability provides a mechanism for raising the performance of memory arrays beyond present levels/yields. By operating the cell and observing changes in performance caused by the asymmetry, the dynamic stability of the SRAM cell can be studied over designs and operating environments. The asymmetry can be introduced by splitting one or both power supply rail inputs to the cell and providing differing power supply voltages or currents to each crosscoupled stage. Alternatively or in combination, the loading at the outputs of the cell can altered in order to affect the performance of the cell. A memory array with at least one test cell can be fabricated in a production or test wafer and internal nodes of the memory cell can be probed to provide further information.

8 Claims, 6 Drawing Sheets

U.S. PATENT DOCUMENTS 7,184,333 B2 2/2007 Yamada et al.
7,301,835 B2 * 11/2007 Joshi et al. .................. 365/201
2005/0063232 A1 3/2005 Chan et al.
2005/0078508 A1 4/2005 Chan et al.

* cited by examiner

INTERNALLY ASYMMETRIC METHODS AND CIRCUITS FOR EVALUATING STATIC MEMORY CELL DYNAMIC STABILITY

CROSS-REFERENCE TO RELATED APPLICATION

The present application is a Continuation of Parent U.S. patent application Ser. No. 11/225,652 filed Sep. 13, 2005 now U.S. Pat. No. 7,301,835 and is related to Divisional U.S. patent applications Ser. Nos. 11/685,904 and 11/685,905 both filed on Mar. 14, 2007, which are Divisions of the above-referenced parent application. The present application is further related to co-pending U.S. patent application "BITLINE VARIABLE METHODS AND CIRCUITS FOR EVALUATING STATIC MEMORY CELL DYNAMIC STABILITY", Ser. No. 11/225,571, which was filed concurrently with the Parent U.S. patent application by the same inventors and assigned to the same Assignee. The specification of the above-referenced application Ser. No. 11/225,571 is incorporated herein by reference.

BACKGROUND OF THE INVENTION

1. Technical Field

The present invention relates generally to static memory circuits, and more particularly to a method and circuit for evaluating the dynamic stability of static memory cell designs.

2. Description of the Related Art

Memory speed and other performance factors are critical limitations in today's processing systems and are predicted to become even more of a critical limitation as technologies move forward. In particular, static random access memories (SRAMS) and memory cells are used in processor caches, registers and in some designs external to the system processors for fast access to data and program instructions.

With processor cycle frequencies reaching well above 4 Ghz, development of SRAM cells that can store and provide access to stored values within that period has become necessary. However, process scales necessary to achieve such access times are also increasingly subject to variability in circuit parameters such as device threshold voltages and channel dimensions. The variability is present both with respect to parameters of each die and across the production process where die-to-die variation must also be controlled, but tolerated within the robustness of the circuit design. Further, negative bias temperature instability (NBTI) provides another variable that changes over circuit lifetime and dictates a minimum voltage at which the cell state can be toggled during the entire lifetime of the circuit.

Present techniques for evaluating the AC performance of memory cells typically analyze the cell using a static "butterfly" curve to evaluate static margins of the cell signals. The butterfly curve describes the switching action of a cross-coupled inverter pair that provide the static memory cell function. The static butterfly curve analysis is not adequate for analyzing memory circuits scaled for operation at the above-mentioned frequencies, as dynamic effects in the devices are increasingly important as operating frequencies are increased and power supply voltages are decreased.

It is therefore desirable to provide a method and circuit for evaluating static memory cell stability as process size and power supply voltages are decreased.

SUMMARY OF THE INVENTION

The objective of evaluating SRAM cell stability is accomplished in a method and circuit. The circuit provides a unique mechanism for evaluating SRAM cell stability by introducing a variable asymmetry between the two cross-coupled stages of the SRAM cell latch. The stability of the SRAM cell can then by studied as the asymmetry is increased by observing when unstable operation occurs.

The asymmetry alters the voltage swing at an input of one of the two cross-coupled stages as provided by the output of the other one of the stages. The asymmetry can be introduced by splitting one or both power supply rails provided to the two cross-coupled stages and/or loading the outputs of the stages asymmetrically. If the power supply rail(s) is split, the power supply voltage (or current) supplied to one of the stages can be directly varied. Both leakage and loading can be adjusted in the circuit and either can be adjusted in conjunction with a power supply voltage change on one of the stages, as well.

Leakage through the pass transistors can be studied by programming the states of other cells in the bit columns to different states, with all cells being the opposite state for read and the same state for write presenting the worst-case leakage state. Loading on the bitlines can be varied by switching pass transistors provided between multiple test columns so that dynamic performance over different loading configurations can be evaluated.

The circuit under test may be a 6 transistor cell with a pair of cross-coupled back-to-back complementary transistor inverters with a series word/bit-line transmission control transistor between the output of each inverter and the corresponding word/bit-line or the cell may be a different design.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns test fixtures and methods for measuring the performance of memory arrays in order to facilitate design improvement and determination of operating margins. In particular, a special test cell is provided in a memory array, which may be a production memory array tested for ongoing product analysis or a test memory array implemented and tested for laboratory analysis. The special test cell has an isolated power supply rail connection to one or both power supply rails, permitting alteration of the voltage swing at the input of one of the cross-coupled inverter stages forming the test memory cell by altering the output swing of the other inverter stage. The output swing can be adjusted by controlling the voltage supplied to each stage in the cell or controlling the current supplied to the two cell stages. The cell also includes test point connections permitting probing the internal nodes at the inverter inputs and corresponding opposite inverter outputs.

The memory array and methods probe the test points and logical state (storage state) of the test memory cell and observe its operation over changes in voltage at one or both of the power supply rail inputs to the test memory cell. Additionally, special test methodologies alter the leakage effects on the test memory cell's storage states and output voltages, and the test memory cell can also be tested across various loading conditions. The loading conditions can be varied by building test arrays of various column dimension so that the loading at the outputs of the cell can be studied. Alternatively, a test array may include pass transistors controlled by special test logic that can switch in additional loading cells on a column and/or short between columns, while ensuring that only the test cell is enabled onto the bitlines when the pass transistors are enabled.

The tests and circuits of the present invention can be performed and implemented in conjunction with the tests and circuits included in the above-incorporated co-pending U.S. patent applications. In particular, the tests and circuits disclosed in the above-incorporated U.S. patent application entitled "BITLINE VARIABLE METHODS AND CIRCUITS FOR EVALUATING STATIC MEMORY CELL DYNAMIC STABILITY" can be performed and implemented simultaneously with the tests disclosed herein to introduce additional variables in a study of cell noise and stability in order to enhance the stability/noise data gathering capabilities of the present invention. The circuits disclosed herein therefore include the essential elements to perform the additional tests, as do the circuits disclosed in the above-referenced U.S. patent application.

Figure 1:
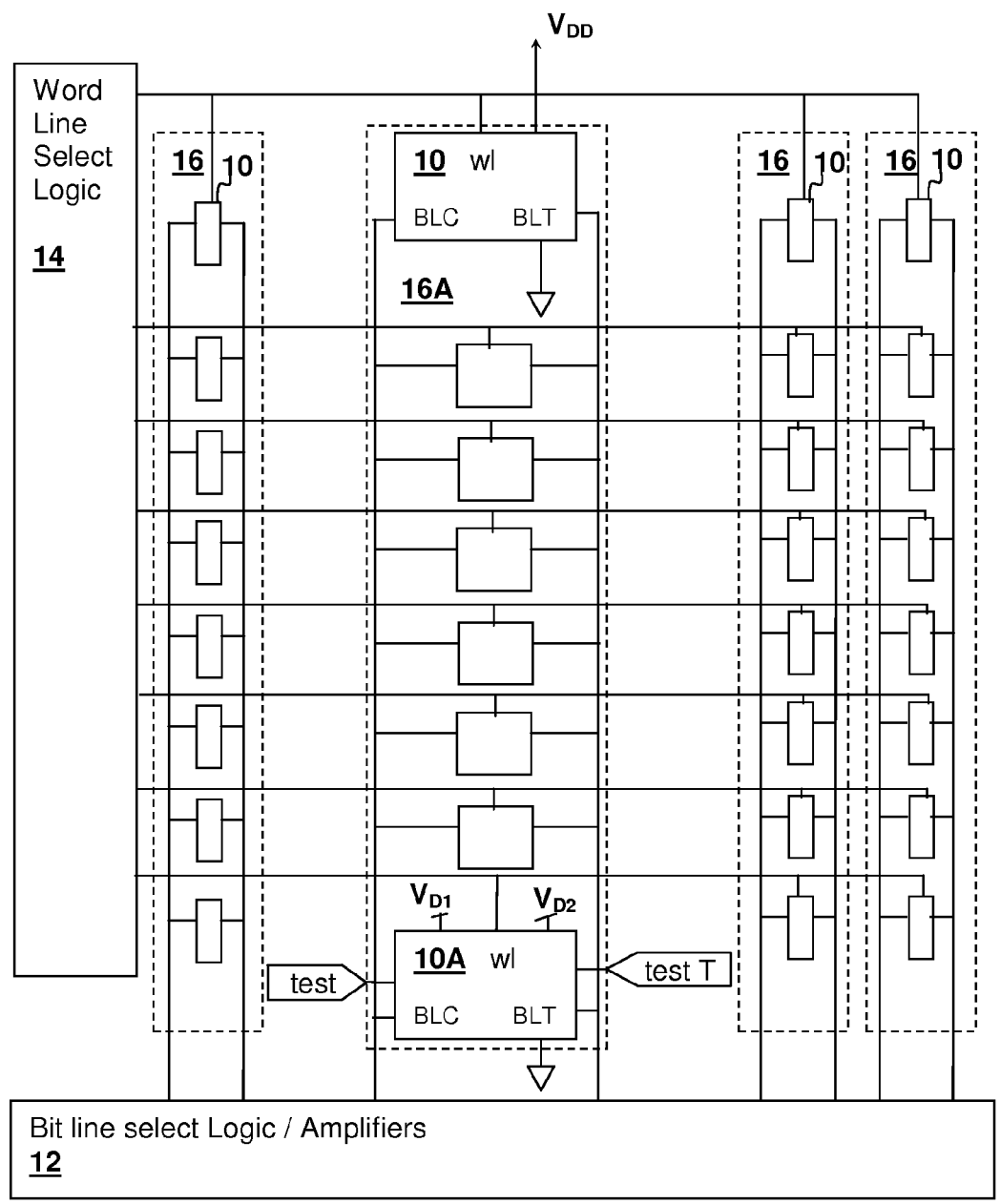
FIG. 1 is a schematic diagram of a memory array in accordance with an embodiment of the invention.

With reference now to the figures, and in particular with reference to FIG. 1, a memory array in accordance with an embodiment of the invention is shown. The memory array includes multiple memory cell columns 16 assembled from memory cells 10 and additionally, at least one test column 16A that includes at least one test memory cell 10A that is of the same transistor parameter design as memory cells 10 but includes additional test features. Test memory cell 10A along with memory cells 10 includes bitline and bitline complement connections to a bitline select logic/sense amplifiers 12 block that selects the appropriate column output and provides the value of the memory cell to external circuits in response to a memory read operation. The row is selected by a particular word line asserted from a word line select logic 14. Word line select logic 14 and bitline select logic/sense amplifiers 12 are only needed in complete form for operationally functional memory arrays and a test memory array can be constructed without the complete functionality of a production memory array. However, to perform all of the tests that will be described below, the ability to write all memory cells 10 including test memory cell 10A as well as the ability to read at least the logical value of test memory cell 10A is needed. However, such reading and writing can be performed via boundary scan circuits or other techniques that do not require the full read/write access logic of a production static memory array.

Unique to the memory array of FIG. 1 are split power supply connections to test memory cell 10A, which are shown as $V_{D1}$ and $V_{D2}$. One of power supply connections $V_{D1}$ and $V_{D2}$ may be connected to the $V_{DD}$ power supply rail that supplies the remainder of the memory array. Also, or in the alternative, the ground connection to test cell 10A can be isolated. In essence, the isolation of at least one of the power supply rails supplying at least one of the cross-coupled stages that provides the storage latch within test memory cell 10A permits varying the voltage swing at the input of the other stage. Reducing the voltage swing of the stage that is making the storage state change permits evaluation of the "noise level" of the memory cell as the voltage swing is decreased or determining the "noise margin" of the memory cell under particular leakage, loading and operating conditions.

Figure 2:
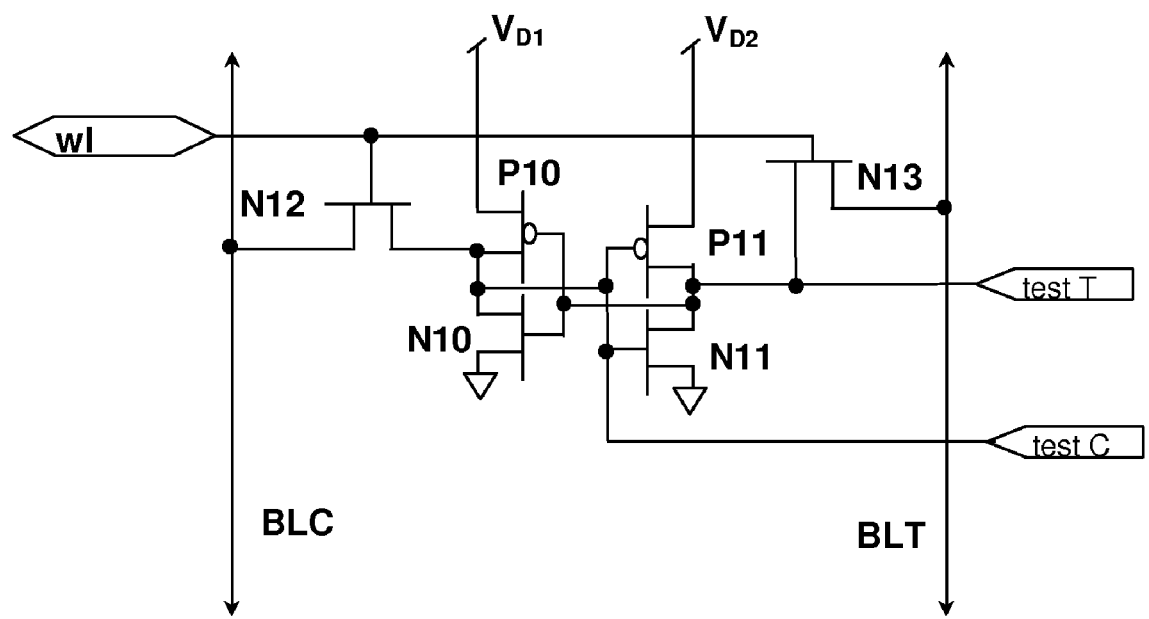
FIG. 2 is a schematic diagram of test memory cell 10A of FIG. 1.

Referring now to FIG. 2, details of test memory cell 10A of FIG. 1 are shown in accordance with an embodiment of the invention. Transistors P10, N10, P11 and N11 form a static latch that provides the storage of a value in the cell via a pair of cross-coupled inverter stages. Transistors N10 and P10 form one inverter stage and transistors N11 and P11 form the other inverter stage. Transistors N12 and N13 provide for access to the value in response to a wordline select signal WL. Bitlines BLT (true bitline) and BLC (complement bitline) couple all cells in a column, so that when a row is selected by signal WL, only one row cell from each column is exposed to the memory logic. For a write operation, bitlines BLC and BLT are charged to voltages corresponding to the desired state of the memory cell and WL is activated (pulsed), setting the state of the latch formed by transistors P10, N10, P11 and N11. For a read operation, the bitlines BLC and BLT are previously charged to opposite state predetermined voltages (generally $V_{DD}$ and ground), and to commence the read, WL is pulsed and a sense amplifier coupled to bitlines BLC and BLT determines the stored state by differential comparison of bitlines BLC and BLT. While the illustrated cell is an example of a cell of order 4 that may be analyzed and improved by a method according to an embodiment of the invention, it should be understood that the techniques illustrated herein may be applied to static memory cells of any order. Internal nodes of test memory cell 10A are accessible via test points (Test T and Test C) that permit measurement of the state and noise levels within the storage latch of test memory cell 10A and are generally brought out on test pads accessible by a test system. Addition of pads and lines for test points Test T, Test C add a degree of capacitance that must be taken into account in any implementation and measurement.

As pointed out above, test memory cell 10A differs from typical memory cells (and the other memory cells 10 in the memory array of FIG. 1) in that separate power supply connections $V_{D1}$ and $V_{D2}$ are provided so that a different voltage that is generally lower than $V_{DD}$ can be supplied to at least one of the inverters forming memory cell 10A for testing of dynamic characteristics of the memory cells. The testing is performed so that variations in the parameters of the devices in the memory cells do not cause the devices to fail. Changing the output voltage of one of the inverters introduces an asymmetry that simulates conditions that occur due to asymmetry in devices making up the memory cells that can cause a failure in a memory cell write operation or cause the state of a memory cell to toggle when read.

In particular, with respect to the memory cell depicted in FIG. 2, when the stored value is a logical "0" (with respect to the bitline values), the common channel connection of transistors P10 and N10 is near ground. When a logical "1" is written to the cell, if transistors P10, N11 and/or N12 are "weak" (i.e., high resistance) and/or transistors N10 and/or P11 are too "strong" (i.e., low resistance) the write operation can fail to change the state of the memory cell. For a read operation, if transistor N11 is weak and transistors P11 and/or N13 are strong, a read operation may change the state of the cell. When the value stored in the memory cell is a logical "1", the critical transistor sets are reversed, with variations in transistors N12, N10 and P10 causing potential failure of the write operation and variations transistors N11, N13 and P11 causing potential failure of the read operation.

Static tests or simulations will not reveal all of the performance characteristics due to the device parameter changes, as charge-sharing effects and other dynamic characteristics can cause the memory cell to fail in dynamic operation, but appear to operate properly when statically operated or simulated. The above operations can be simulated by reducing voltage $V_{D1}$ while maintaining voltage at full $V_{DD}$ and reading/writing test memory cell 10A using a pulse width consistent with the normal access times of test memory cell 10A.

Another effect that can change the performance of memory cells 10 and test memory cell 10A is the effect of leakage from other non-enabled cells 10 connected to the column bitlines (i.e., those memory cells 10 in column 16A of FIG. 1). Depending on the voltage present on the opposite side of the pass transistors that connects each memory cell 10 to the bitlines, the leakage polarity will differ, and therefore the states of the memory cells connected to the same bitlines can change the performance of test memory cell 10A. The method of the present invention performs tests on test memory cell 10A that include algorithms to vary the bitline values on non-enabled cells in order to determine their effect on test memory cell 10A performance. Further, the loading on the bitlines also has an effect on memory cell performance independent of the state of the other memory cells. Both the leakage and loading effects change with the dimensions of the memory array in that the larger the column, i.e., the number of memory cell 10 connected to a common pair of bitlines, the greater the potential leakage and loading effects. The present invention includes in some embodiments, the ability to change the loading as well as the leakage level on the bitlines by shorting additional columns 16 onto a bitline. Alternatively, different configurations can be fabricated in a test memory array and compared for performance while using test memory cell 10A to alter operating characteristics.

Figure 3:
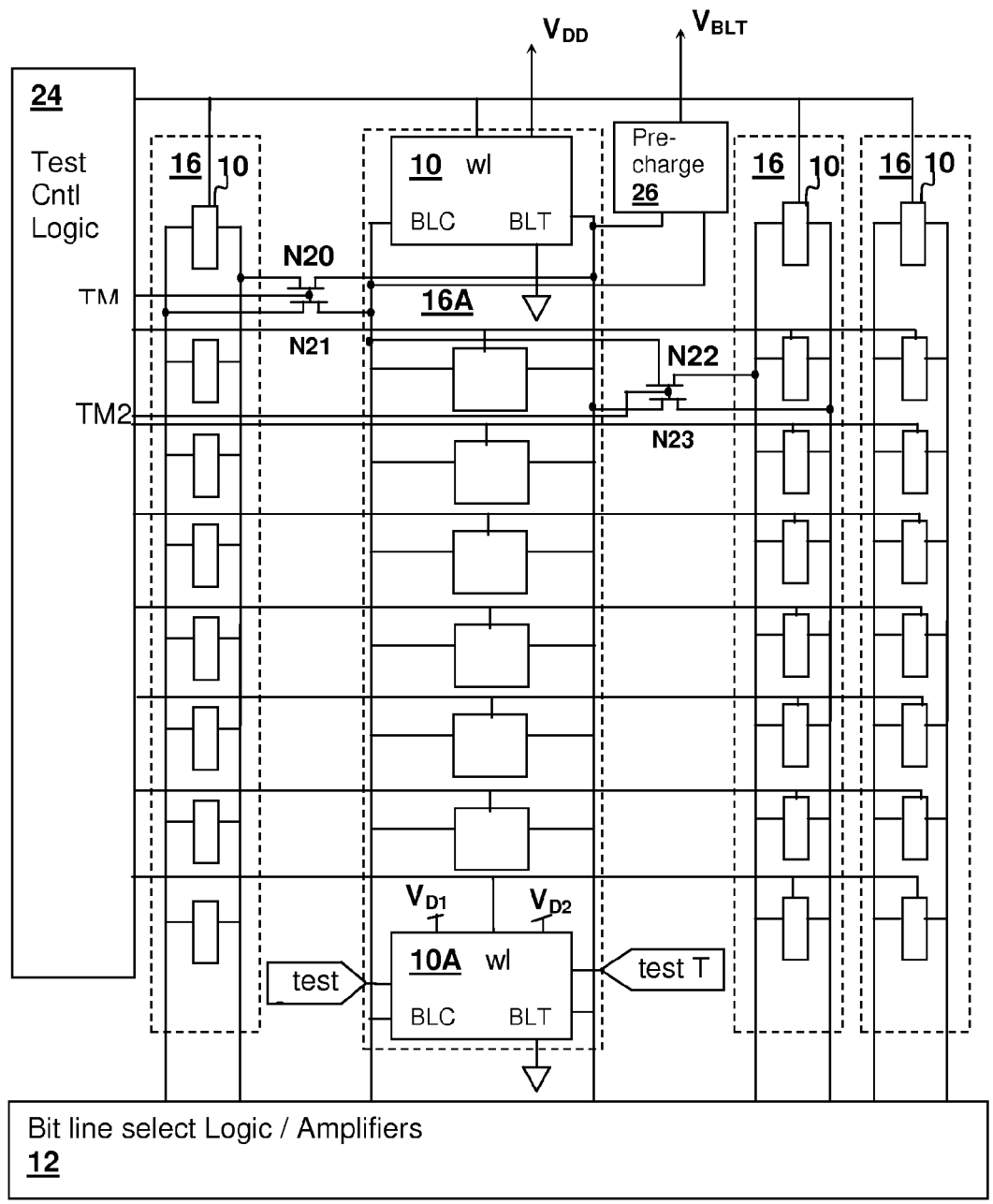
FIG. 3 is a schematic diagram of a memory array in accordance with another embodiment of the invention.

Referring now to FIG. 3, a memory array in accordance with another embodiment of the present invention is depicted. The depicted embodiment is similar to the array of FIG. 1 and therefore only differences between them will be described below. In the memory array of FIG. 3, pass transistors N20 and N21 connect corresponding column bitlines of test column 16A and another column 16 in response to a test mode control signal TM1 supplied by a test control logic 24. Another pair of pass transistors N22 and N23 provide connection to yet another column. Pass transistor pairs may connect each pair of adjacent columns so that a larger column is built-up through multiple cascades through the pass transistors. Alternatively, the pass transistors may connect a number of same-sized columns to a single test column 16A, or may switch in banks of columns with a progressively increasing number of connected cells.

Test control logic 24 includes such signals as are needed to control the gates of pass transistors N20-23 along with any others, and latches to accept and hold the programmed states of the pass transistors during a test cycle. Test control logic 24 can also include logic to support operation as a functional production memory array by ensuring that pass transistors N20-23 are turned off except when a test mode is enabled. Test control logic 24 includes a mechanism for selectively activating one or more pairs of pass transistors N20-23 to change the leakage/loading level on the column bitlines. The mechanism may be a specific memory location write for a test array, or may be a boundary scan implementation in a production array, where the latch that activates pass transistors N20-23 is set to a logic low level until stimulated by a boundary scan write operation.

Also, a special pre-charge circuit 26 is shown that provides for pre-charging the bitlines to a controllable voltage as disclosed in the above-incorporated U.S. patent application BIT-LINE VARIABLE METHODS AND CIRCUITS FOR EVALUATING STATIC MEMORY CELL DYNAMIC STABILITY". By pre-charging the bit-lines or not pre-charging the bit-lines, the effect of bit-line pre-charging on cell stability can be studied. Further, by varying voltage $V_{BLT}$, which is the voltage used to provide the charging source, study of the effect of device strength or weakness in the cells can also be studied. The pre-charge voltage is generally supplied through switch transistors in pre-charge circuit that are either turned weakly during the entirety of a read operation or are momentarily pulsed prior to the read operation. The pre-charge circuit switches are connected to $V_{BLT}$, which may be derived on-die or supplied through a test pad and applied through the switches to the associated column bitlines to raise the voltage of the bitlines to a voltage near $V_{BLT}$. When a read operation occurs, depending on the bitline voltage and the cell stability, the cell may change state on a read, much as an asymmetry in the cell may cause a state change upon a read operation. A weak inverter pulling the low state on a bitline may be "swamped" by a bitline weakly pulled or charged to a high $V_{BLT}$, causing the input of the other stage to rise higher than desired when the pass transistor to the connected bitline is enabled. The resulting voltage rise will cause the cell to change stage during the read operation. Having control of the bitline voltage allows discovery of the bitline voltage at which the cell shows instability, which provides a measure of the cell stability margin under normal operating conditions and/or across process variations. As an alternative to implementing pre-charge switches or current sources on the die, the bitlines can be connected to pads and directly pre-charged from a source in a wafer tester prior to a read operation.

Figure 4:
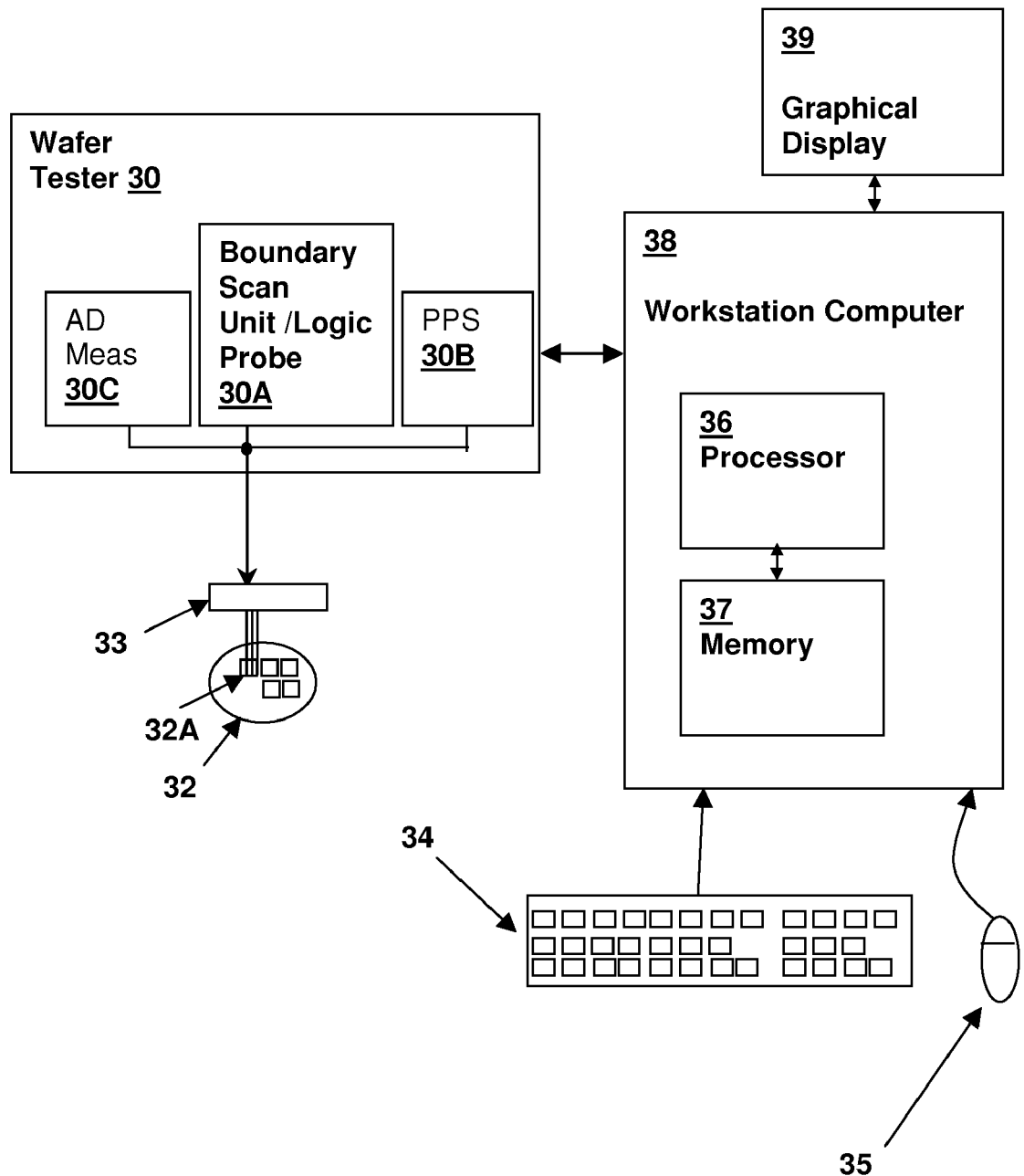
FIG. 4 is a block diagram of a wafer test system for testing a memory array via a method in accordance with an embodiment of the invention.

Referring now to FIG. 4, a VLSI wafer test system, in which methods according to an embodiment of the present invention are performed, is depicted. A wafer tester 30 includes a boundary scan unit 30A for providing stimulus to and retrieving data from a die 32A on a wafer under test 32 via a probe head 33 having electrical test connections to die 32A. Wafer tester 30 also includes a programmable power supply 30B for supplying power supply rail voltage $V_{D1}$ and/or power supply voltage $V_{D2}$ to test memory cell 10A. Alternatively, programmable power supply 30B may control one or more programmed (limited) power supply currents supplied to terminals labeled $V_{D1}$ and/or $V_{D2}$. Wafer tester 30 also includes an analog or digital measurement subsystem 30C for observing the states/values of the test points of test memory cell 10A that bring out test points Test T, Test C that are connected to the internal nodes of the storage latch within test memory cell 10A. By measuring the voltage internal nodes of test memory cell 10A, the cell state and level of noise in the storage cell can be determined directly and independently from the bitline states and noise.

A workstation computer 38, having a processor 36 coupled to a memory 37, for executing program instructions from memory 37, wherein the program instructions include program instructions for receiving data produced by circuits within wafer 32 in accordance with an embodiment of the present invention, is coupled to wafer tester 30. The data produced by embodiments of the present invention are collected from multiple tests of test memory cells 10A within dies 32A as one or more of the test memory cell 10A power supply voltages are varied by programmable power supply 30B, and loading/leakage characteristics are changed by using boundary scan unit 30A to read/write test memory cell 10A values, connect additional columns to increase loading/leakage characteristics and to set the states of other memory cells 10 to observe changes in leakage due to the states of other memory cells 10 in relation to the state of test memory cell 10A. Measurement from analog or digital measurement subsystem 30C further increase the performance data set collected from measurements on test memory cell 10A. The results of all of the measurements can then be evaluated to either change the design of the array or memory cells 10, determine whether fabrication process has deviated exceedingly from tolerable norms or to determine operational ranges such as power supply voltage tolerances and access times.

Data from memory tests in accordance with embodiments of the invention are transferred to workstation computer 38 via wafer tester 30 and stored in memory 37 and/or other media storage such as a hard disk. Workstation computer 38 is also coupled to a graphical display 39 for displaying program output such as the results of memory tests described hereinafter. Workstation computer 38 is further coupled to input devices such as a mouse 35 and a keyboard 34 for receiving user input. Workstation computer may be coupled to a public network such as the Internet, or may be a private network such as the various "intra-nets" and software containing program instructions for analyzing data produced by methods and circuits in accordance with embodiments of the present invention may be located on remote computers or locally within workstation computer 38. Further, workstation computer 38 may be coupled to wafer tester by such a network connection.

While the system of FIG. 4 depicts a configuration suitable for sequential test of a plurality of dies on a wafer, the depicted system is illustrative and not limiting to the present invention. Probe head 33 may be a multi-die full wafer probe system, or may comprise multiple probe heads for simultaneously testing multiple wafers on a single or multiple die basis. Additionally, while boundary data retrieval and stimulus is illustrated, the techniques of the present invention may also be applied to other interfaces available to probe wafer 32, or applied to circuits implemented in fully functional dies where data extraction is performed over a serial or parallel bus or other interface.

Figure 5:
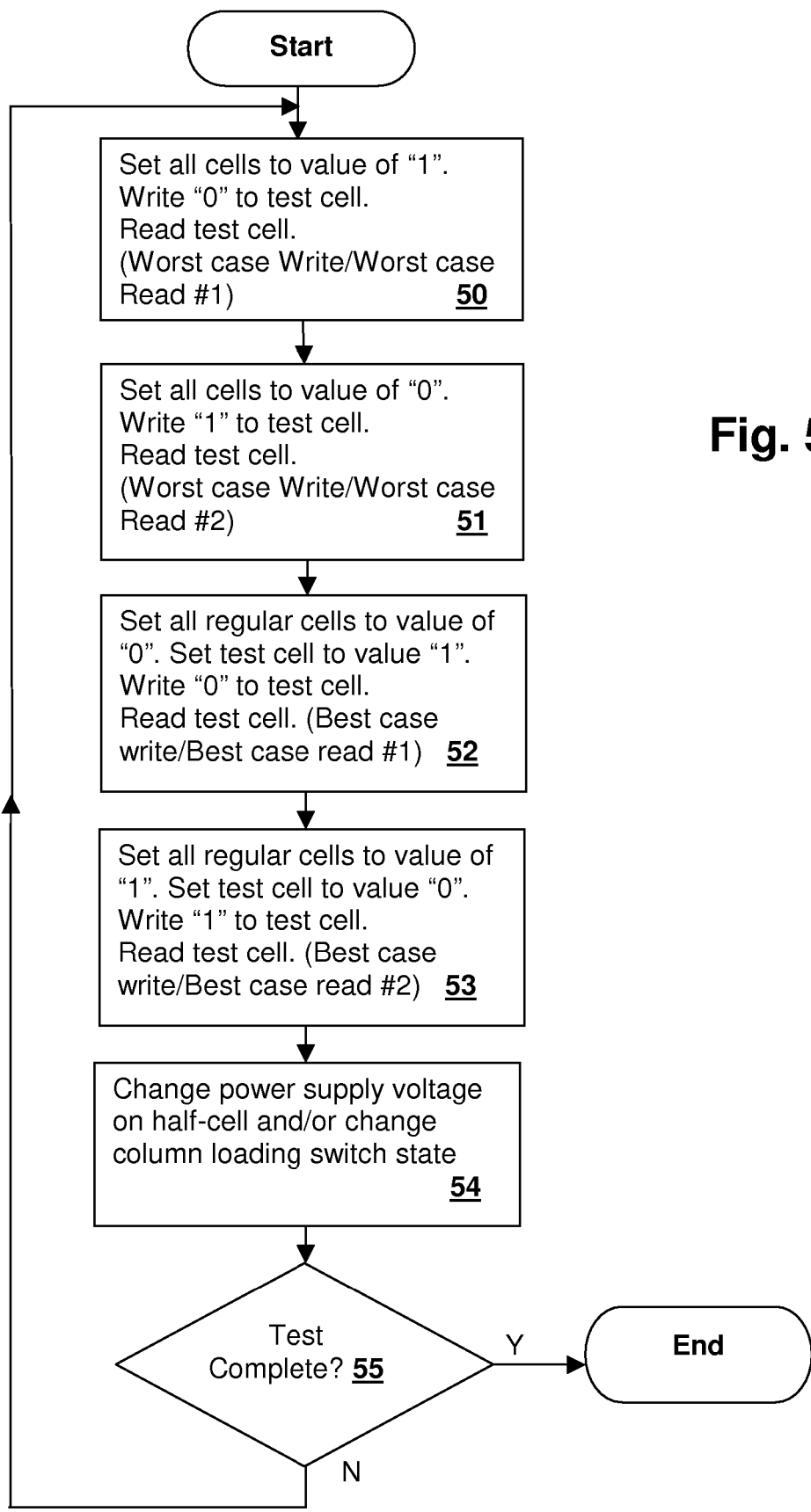
FIG. 5 is a flowchart illustrating a method in accordance with an embodiment of the invention.

Referring now to FIG. 5, a method in accordance with an embodiment of the present invention is depicted in a flowchart. Four separate tests are depicted, but many other combinations of tests are possible within the context of the present invention. In general, a worst-case leakage test includes programming all of the other memory cells to the opposite state for a read operation. The other cells are initially the same state for a worst-case write operation. In the method as illustrated, first all cells are set to the value of "1", a "0" is written to the test cell and the test cell is read to perform a worst case write/worst case read test (step 50). All cells are set to the value of "0", a "1" is written to the test cell and then the test cell is read to perform the worst case write/worst case read test of the opposite polarity (step 51). Next all regular cells are set to the value of "0" and the test cell is set to the value of "1", a "0" is written to the test cell and the test cell is read to perform a best case write/worst case read test (step 52). Finally, all regular cells are set to the value of "0", the test cell is set to the value of "1" then a "0" is written to the test cell and the test cell is read to perform the best case write/worst case read test of opposite polarity (step 53). Other combinations of best case/worst case are possible and can be tested in conjunction with the tests above, or some tests may be omitted, depending on the information needed. Production tests generally require less information than laboratory tests used to verify and/or modify a design. After the tests have been run, a change in power supply voltage for one of the stages (half-cell) can be adjusted and/or the loading factor changed by altering the column loading pass device switch states (step 54) and if the testing is not complete (step 55) the tests can be repeated at the new voltage/loading state. All or part of the tests can be repeated after temperature cycling in order to determine changes due to NBTI, and tests are also performed over temperature and $V_{DD}$ ranges as well as the voltage asymmetry variations, in order to verify performance over intended operating conditions.

Figure 6:
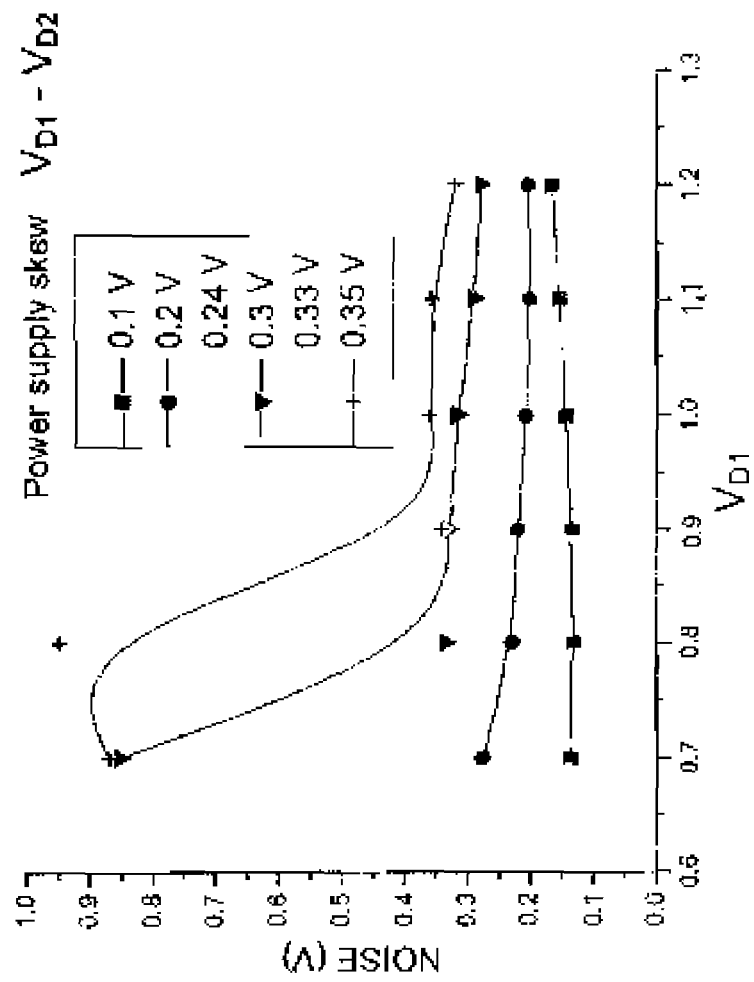
FIG. 6 is a graph depicting results of an analysis of a memory cell according to a method in accordance with an embodiment of the invention.

Referring now to FIG. 6, a graph depicting results of a method in accordance with an embodiment of the invention is shown. The graph depicts noise levels on the low "0" side of test memory cell 10A versus supply voltage (e.g., $V_{D1}$) as the difference between $V_{D1}$ and $V_{D2}$ is altered. The different curves correspond to different values of $V_{D1}$-$V_{D2}$ in the example. It can be seen that as the voltage asymmetry is increase to levels approaching the midpoint of the supply (around 33%) the noise level shifts abruptly, corresponding to complete failure (i.e., the memory cell is in the incorrect state). Curves such as that depicted in FIG. 6 can be generated for each loading/leakage state as selected in the test array of FIG. 3 and generated for each test type depicted in the flowchart of FIG. 5 in order to gather complete information about the dynamic stability of the memory cells. For NBTI testing, the wafer can be heat treated and the tests performed again in order to evaluate the effect of NBTI on stability.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A memory device, comprising:
   at least one test memory cell comprising a symmetric storage latch including a first inverter stage and a second inverter stage with an output of the first inverter stage providing an input to the second inverter stage and an output of the second inverter stage providing an input to the first inverter stage whereby a state of the at least one test memory cell is statically maintained;
   a plurality of other memory cells coupled to at least one bitline to form a column; and
   an asymmetric pair of power supply connections, a first connection to a first power supply input of said first inverter stage and a second connection to a second power supply input of said second inverter stage, whereby a stability of said at least one test memory cell can be evaluated by varying the asymmetry between said pair of power supply connections by varying a power supply voltage provided to the first power supply input and observing operation of said at least one test memory cell, and wherein the asymmetry is not applied to the other memory cells.

2. The memory device of claim 1, wherein said first connection is at a test point, whereby a test system alters said power supply voltage of said first inverter stage with respect to a power supply voltage of said second inverter stage by supplying said power supply voltage of said first inverter stage by contact of a probe with said test point.

3. The memory device of claim 1, further comprising a test point connected to the output of the first inverter stage, whereby a test system measures internal characteristics of said at least one test memory cell by contact of a probe with said test point.

4. The memory device of claim 1, wherein said at least one test memory cell is coupled to said at least one bitline of said memory device via a corresponding pass device, whereby a value of said at least one test memory cell can be read or written by enabling said at least one pass device.

5. The memory device of claim 4, wherein said plurality of other memory cells include other corresponding pass devices to isolate said other memory cells from said at least one bitline while said at least one test memory cell is read to or written from.

6. The memory device of claim 1, wherein said first inverter stage comprises:
   a first transistor having a first channel connection connected to said first power supply input; and
   a second transistor having a first channel connection connected to a second channel connection of said first transistor and to an input of said second inverter stage, a second channel connection connected to an opposite power supply rail, and a gate connection connected to a gate connection of said first transistor and said output of said second inverter stage.

7. The memory device of claim 6, wherein said second inverter stage comprises:
   a third transistor having a first channel connection connected to said second power supply input; and
   a fourth transistor having a first channel connection connected to a second channel connection of said third transistor and to said gate connection of said first and second transistors, a second channel connection connected to an opposite power supply rail, and a gate connection connected to a gate connection of said third transistor and said first channel connection of said second transistor.

8. The memory device of claim 7, wherein said second connection to said second power supply input of said second inverter stage is provided at a test point, whereby a test system alters said power supply voltage provided to said first inverter stage with respect to another power supply voltage provided to said second inverter stage by supplying said power supply voltage provided to said first inverter stage by contact of a probe with said test point.

\* \* \* \* \*